United States Patent
Wakabayashi et al.

(10) Patent No.: US 9,661,792 B2
(45) Date of Patent: May 23, 2017

(54) PROTECTOR AND WIRE HARNESS

(71) Applicant: Sumitomo Wiring Systems, Ltd., Yokkaichi, Mie (JP)

(72) Inventors: Masataka Wakabayashi, Yokkaichi (JP); Kuniaki Kamijo, Yokkaichi (JP)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days.

(21) Appl. No.: 15/178,875

(22) Filed: Jun. 10, 2016

(65) Prior Publication Data

US 2016/0366796 A1  Dec. 15, 2016

(30) Foreign Application Priority Data

Jun. 15, 2015 (JP) .................................. 2015-120076

(51) Int. Cl.
| | |
|---|---|
| H05K 9/00 | (2006.01) |
| B60R 16/02 | (2006.01) |
| H02G 3/04 | (2006.01) |
| H01F 17/06 | (2006.01) |

(52) U.S. Cl.
CPC ....... *H05K 9/0098* (2013.01); *B60R 16/0215* (2013.01); *H02G 3/0437* (2013.01); *H02G 3/0487* (2013.01); *H01F 2017/065* (2013.01)

(58) Field of Classification Search
CPC ........................ H01F 2017/065; H05K 9/0098
See application file for complete search history.

(56) References Cited

U.S. PATENT DOCUMENTS

| | | | | |
|---|---|---|---|---|
| 5,287,074 A | * | 2/1994 | Meguro | H03H 1/0007 333/12 |
| 7,064,724 B2 | | 6/2006 | Louzir | |
| 7,498,516 B1 | * | 3/2009 | He | A61N 1/3754 174/94 R |
| 2006/0172593 A1 | * | 8/2006 | Kobayashi | H01F 17/06 439/559 |
| 2007/0120635 A1 | * | 5/2007 | Kobayashi | H01F 17/06 336/174 |

(Continued)

FOREIGN PATENT DOCUMENTS

| | | |
|---|---|---|
| JP | 2005044607 A | 2/2005 |
| JP | 2005080293 A | 3/2005 |

(Continued)

*Primary Examiner* — Hung V Ngo
(74) *Attorney, Agent, or Firm* — Reising Ethington, P.C.

(57) ABSTRACT

A protector and a wire harness that have piercing resistance, give shielding capability to the protector, enable reducing the number of man-hours in human labor, and are low cost. In the protector, foaming urethane layers that have a predetermined thickness and contain a high magnetic permeability metal powder are respectively formed on a recessed surface portion of a protector main body and an inner surface portion of a cover portion, and foil films are respectively formed on an outer surface portion of the protector main body and an outer surface portion of the cover portion. The wire harness is formed by using the cover portion to close the opening portion of the recessed surface portion of the protector main body in which a group of electrical lines is inserted and accommodated. Pieces of adhesive tape are wrapped around the protector main body and the cover portion to fasten them.

4 Claims, 9 Drawing Sheets

(56) References Cited

U.S. PATENT DOCUMENTS

| | | | | |
|---|---|---|---|---|
| 2008/0213615 A1* | 9/2008 | Kino | ................... | H01F 27/255 |
| | | | | 428/596 |
| 2009/0277571 A1* | 11/2009 | Uemura | ................... | H01F 3/14 |
| | | | | 156/228 |
| 2010/0066475 A1* | 3/2010 | Goldblatt | ................. | G01R 1/22 |
| | | | | 336/92 |
| 2010/0170712 A1* | 7/2010 | Konz | ................... | H01F 27/33 |
| | | | | 174/520 |
| 2013/0192888 A1* | 8/2013 | Konz | ................... | H01F 17/06 |
| | | | | 174/350 |
| 2013/0222103 A1* | 8/2013 | Kawai | ................... | H01F 27/02 |
| | | | | 336/175 |
| 2014/0060922 A1* | 3/2014 | Weyrich | ............. | B60R 16/0215 |
| | | | | 174/70 R |

FOREIGN PATENT DOCUMENTS

| | | | |
|---|---|---|---|
| JP | 2011188616 A | | 9/2011 |
| JP | 2015-80293 | * | 4/2015 |

* cited by examiner

PROTECTOR AND WIRE HARNESS

This Application claims the benefit of Japanese Application No. JP2015-120076, filed on Jun. 15, 2015, the contents of which are hereby incorporated by reference in their entirety.

FIELD

The present invention relates to a protector and a wire harness.

BACKGROUND

Conventionally, depending on the location where a wire harness is installed, there is demand for electrical lines or the like to be protected from metal edges and the like of the vehicle body, and also demand for shielding ability, and a protector having shielding capability is attached to the wire harness trunk line.

As one method of giving shielding capability to a protector, the protector is constituted using a metal extrusion-molded member (e.g., see JP 2005-44607A, which is called "Patent Document 1" hereinafter).

Although not directed to a protector, as another method of giving shielding capability, there is known to be a configuration in which metal foil tape is wrapped around a core wire that includes a core line covered by an insulating resin layer (e.g., see JP 2011-188616A, which is called "Patent Document 2" hereinafter).

The method of giving shielding capability by wrapping with metal foil tape is applicable to a protector as well. FIG. 9 is a diagram showing a protector that is the same as the protector in FIG. 1 disclosed in JP 2015-80293A (Patent Document 3). A protector 40 in this figure includes a protector main body 41, a cover portion 43 connected to one side of the open side of the protector main body 41 via a hinge portion 42, and a lock means 44 that is provided as a male and female pair on the protector main body 41 and the cover portion 43 and that locks when the cover portion 43 is closed. Conventionally, there is also a method of giving shielding capability by wrapping metal foil around the outer surface of the protector 40 shown in FIG. 9, for example.

However, the protector disclosed in Patent Document 1 has a problem in that cost is high due to being constituted using a metal extrusion-molded member. The method of giving shielding capability disclosed in Patent Document 2 has a problem in that protection from metal edges and the like is not sufficient. Also, the method of giving shielding capability by wrapping metal foil around the outer surface of the protector 40 shown in FIG. 9 has a problem in that human labor is needed to wrap the metal foil around the protector.

The present design has been achieved in light of the issues described above, and a potential object thereof is to provide a protector and a wire harness that have piercing resistance, enable giving shielding capability to the protector, enable reducing the number of man-hours in human labor, and enable realizing low cost.

SUMMARY

In order to solve the above issues, a protector includes: a protector main body that is made of a synthetic resin and has a groove-shaped recessed surface portion in which a group of electrical lines is to be accommodated, a foil film being formed on an outer surface portion of the protector main body; and a cover portion that is made of a synthetic resin and closes the recessed surface portion of the protector main body, a foil film being formed on an outer surface portion of the cover portion, wherein a foaming urethane layer having a predetermined thickness and containing a high magnetic permeability metal powder is formed on at least the recessed surface portion of the protector main body.

According to the above configuration, the protector main body and the cover portion are made of a synthetic resin rather than being made of metal, and thus have piercing resistance and can be manufactured at low cost. Also, the foil films formed on the outer surface portions of the protector main body and the cover portion have shielding capability, and the foaming urethane layer that is formed in the protector main body and contains a high magnetic permeability metal powder has shielding capability due to foaming and filling in the region surrounding the group of electrical lines. Accordingly, it is possible to improve the shielding capability, and, compared to a conventional configuration in which metal foil is wrapped around the protector, it is also possible to reduce the number of man-hours in human labor by an amount corresponding to eliminating the need for the task of wrapping metal foil around the protector.

It is preferable that a foaming urethane layer having a predetermined thickness and containing a high magnetic permeability metal powder is formed on an inner surface portion of the cover portion as well. According to this configuration, shielding capability is improved further.

In order to solve the above issues, a wire harness includes: a group of electrical lines partially bound at a plurality of locations using adhesive tape; and the protector described above, wherein by performing heating to a predetermined high temperature in a state in which the group of electrical lines is accommodated in a recessed portion of the protector main body and the cover portion is held in a closed state, the foaming urethane layer expands and fills in a region surrounding the group of electrical lines in the protector.

According to the above configuration, the foil films formed on the outer surface portions of the protector main body and the cover portion have shielding capability, and the foaming urethane layer that is formed in the protector main body and contains a high magnetic permeability metal powder has shielding capability due to foaming and filling in the region surrounding the group of electrical lines. Accordingly, it is possible to improve the shielding capability, and it is possible to reduce the number of man-hours in human labor compared to conventional technology that requires human labor for attaching the protector to protect the group of electrical lines, and then wrapping metal foil around the protector.

According to the present design, it is possible to provide a protector and a wire harness that have piercing resistance, enable giving shielding capability to the protector, enable reducing the number of man-hours in human labor, and enable realizing low cost.

DRAWINGS

FIG. 6A shows the configuration of the cross-section before the heating step, and FIG. 6B shows the configuration of the cross-section after the heating step;

Figure 8A:
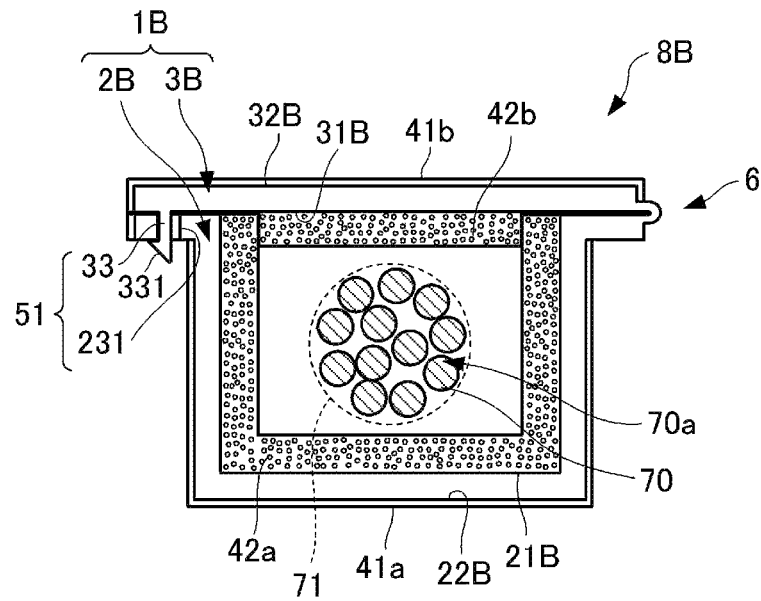
Figure 8B:
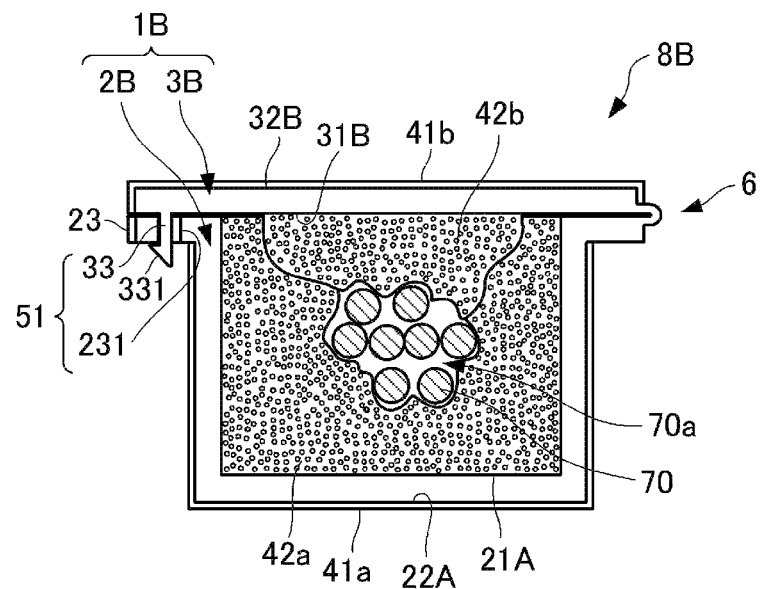
Figure 9:
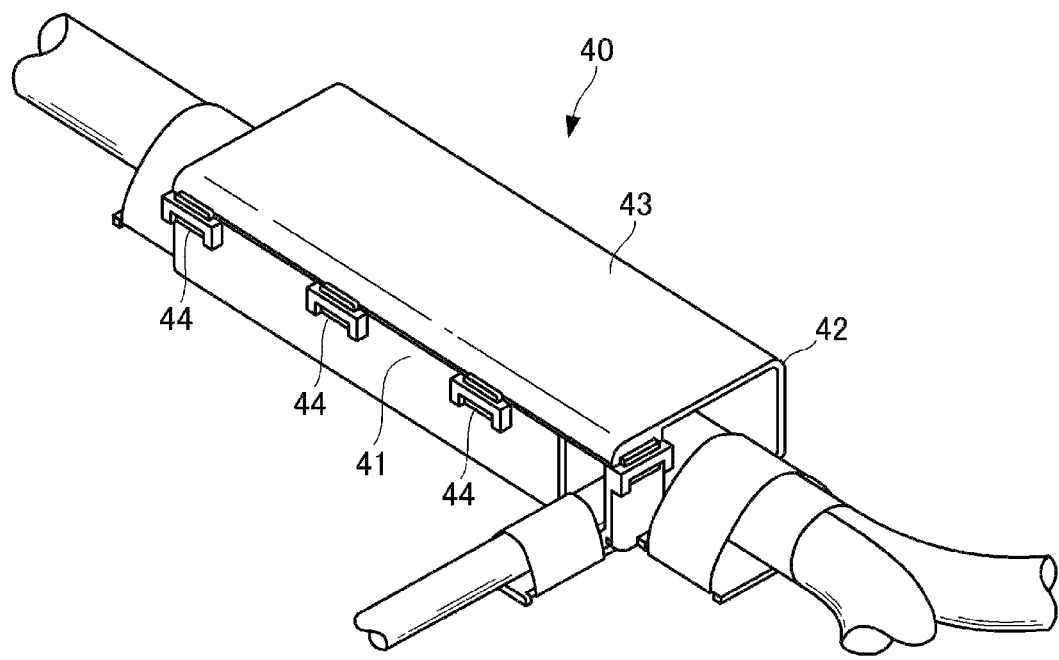

FIGS. 8A and 8B are diagrams showing a configuration of a cross-section of a wire harness that uses the protector according to the third embodiment, where FIG. 8A shows the configuration of the cross-section before the heating step, and FIG. 8B shows the configuration of the cross-section after the heating step; and FIG. 9 is a perspective diagram showing a configuration of a conventional protector.

DESCRIPTION

Hereinafter, embodiments of a protector and a wire harness according to the present invention will be described with reference to the drawings.

First Embodiment

Figure 1:
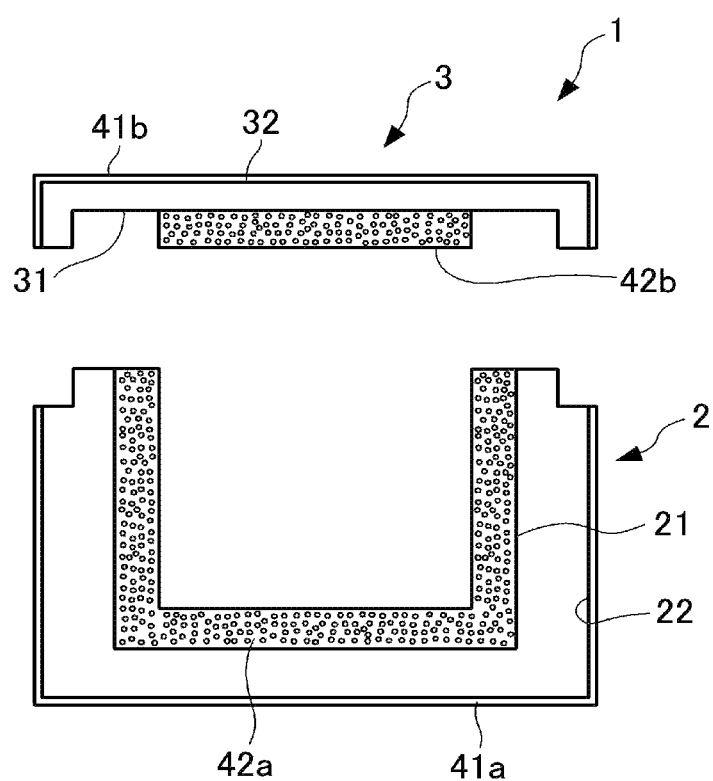
FIG. 1 is a diagram showing a configuration of a cross-section of a protector according to a first embodiment.

As shown in FIG. 1, a protector 1 of the first embodiment is constituted by a protector main body 2, which has a groove-shaped recessed surface portion 21 for accommodating a group of electrical lines, and a cover portion 3 that closes the recessed surface portion 21 of the protector main body 2.

A foaming urethane layer 42a having a predetermined thickness and containing a high magnetic permeability metal powder is formed on the recessed surface portion 21 of the protector main body 2, and a foil film 41a is formed on an outer surface portion 22. A foaming urethane layer 42b similar to the foaming urethane layer 42a, for example, is formed on an inner surface portion 31 of the cover portion 3, and a foil film 41b similar to the foil film 41a, for example, is formed on an outer surface portion 32.

In the protector 1 shown in FIG. 1, the protector main body 2 and the cover portion 3 are constituted using polypropylene (PP), for example. Also, the foil film 41a provided on the protector main body 2 and the foil film 41b provided on the cover portion 3 are each a foil film made of aluminum, for example, and can be formed by vacuum deposition or high frequency ion plating processing. On the other hand, the foaming urethane layers 42a and 42b of the protector main body 2 and the cover portion 3 are formed by applying a foaming urethane material at corresponding locations on the inner surfaces.

In the protector 1, the cover portion 3 is provided so as to be separated from the protector main body 2, and a later-described group of electrical lines 70a is protected by accommodating the group of electrical lines 70a in the groove-shaped opening formed by the recessed surface portion 21 of the protector main body 2, and then covering the opening with the cover portion 3 that is separated from the protector main body 2. Also, the protector 1 is configured such that when it is closed, the closed state is held by wrapping adhesive tape 81 (see FIG. 2C) around it.

The protector 1 of the present embodiment is used in order to cover the group of electrical lines 70a such that the group of electrical lines 70a is shielded from thermal factors and shielded from electrical properties generated by the vehicle body or the like. As will be described later, the aforementioned heat resistance function is achieved by increasing the foaming thickness of the foaming urethane layer 42a and 42b that is applied to the inner surfaces of the protector main body 2 and the cover portion 3 that covers the opening thereof.

Also, the foaming urethane layers 42a and 42b contain a metal powder that has high magnetic permeability. Accordingly, the foaming urethane layers 42a and 42b become foamed due to heat, and as the volume increases, the shielding surface area achieved by the high magnetic permeability metal powder increases, and the shielding capability also increases.

In this way, in the protector 1 of the present embodiment, the protector main body 2 and the cover portion 3 are made of a synthetic resin rather than being made of metal, and thus have piercing resistance and can be manufactured at low cost. Also, with the protector 1, the foil films 41a and 41b formed on the outer surface portions of the protector main body 2 and the cover portion 3 have shielding capability, and the foaming urethane layer 42a that is formed in the protector main body 2 and contains a high magnetic permeability metal powder has shielding capability due to foaming and filling in the region surrounding the group of electrical lines 70a. Accordingly, it is possible to improve the shielding capability, and, compared to a conventional configuration in which metal foil is wrapped around the protector, it is also possible to reduce the number of man-hours in human labor by an amount corresponding to eliminating the need for the task of wrapping metal foil around the protector.

Note that in the present embodiment, besides the configuration in which the foaming urethane layers 42a and 42b are formed on both the recessed surface portion 21 of the protector main body 2 and the inner surface portion 31 of the cover portion 3 as shown in FIG. 1, a configuration is possible in which the foaming urethane layer 42a is provided on only the recessed surface portion 21 of the protector main body 2, for example. It should be noted that in the case where the foaming urethane layer 42b that has a predetermined thickness and contains a high magnetic permeability metal powder is formed on the inner surface portion of the cover portion 3 as well in the protector 1 (see FIG. 1), the shielding capability is improved more than in the case where the foaming urethane layer 42a is provided on only the recessed surface portion 21 of the protector main body 2.

Next, a wire harness 8 of the present embodiment will be described with reference to FIGS. 2A to 2C.

Figure 2A:
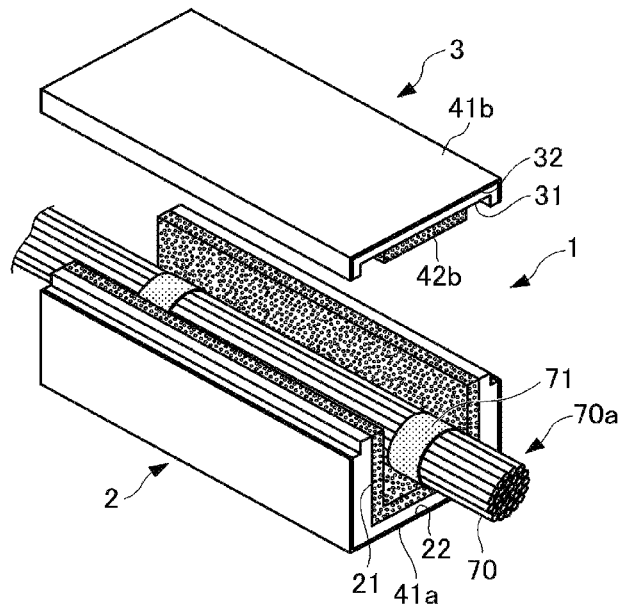
FIGS. 2A to 2C are perspective diagrams showing steps for assembling a wire harness that uses the protector according to the first embodiment.

In order to protect a harness trunk line using the protector 1 of the present embodiment, firstly, multiple electrical lines 70 that are to be protected are bound with pieces of adhesive tape 71 to obtain the group of electrical lines 70a as shown in FIG. 2A. Next, while the cover portion 3 is open, the bound group of electrical lines 70a is accommodated inside the groove-shaped recessed surface portion 21 of the protector main body 2 in an orientation of extending in the lengthwise direction of the groove.

Figure 2B:
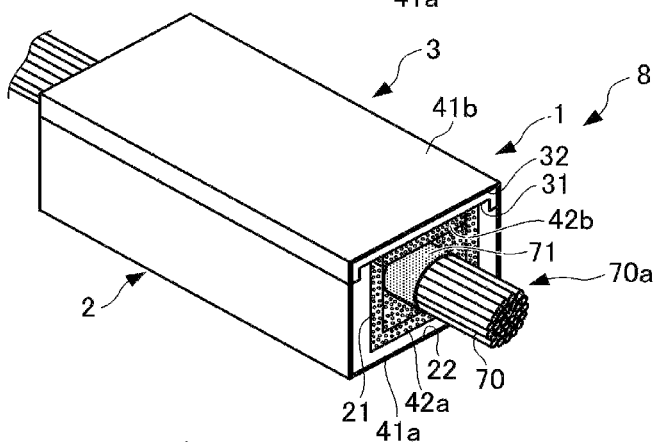
Figure 2C:
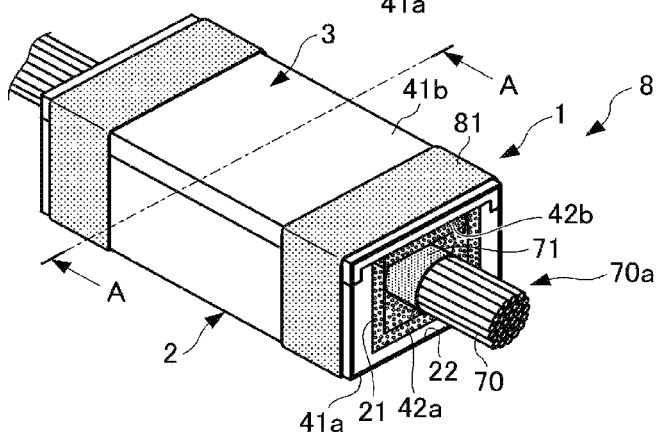

Next, as shown in FIG. 2B, the cover portion 3 is used to close the opening portion of the recessed surface portion 21 of the protector main body 2 in which the group of electrical lines 70a is inserted and accommodated, and then in this state, as shown in FIG. 2C, pieces of adhesive tape 81 are wrapped around the protector main body 2 and the cover portion 3 to fasten them and prevent opening of the cover portion 3.

In FIGS. 2B and 2C, the wire harness 8 of the present embodiment is constituted by the protector 1, which includes the cover portion 3 that closes the protector main body 2, and the group of electrical lines 70a, which passes through the space formed by the recessed surface portion 21 of the protector main body 2 and the inner surface portion 31 of the cover portion 3 of the protector 1. Thereafter, the protector main body 2 and the cover portion 3 of the wire harness 8 are heated from the outside to a temperature of 80° C. or higher, for example, to cause foaming of the foaming urethane material.

Figure 3:
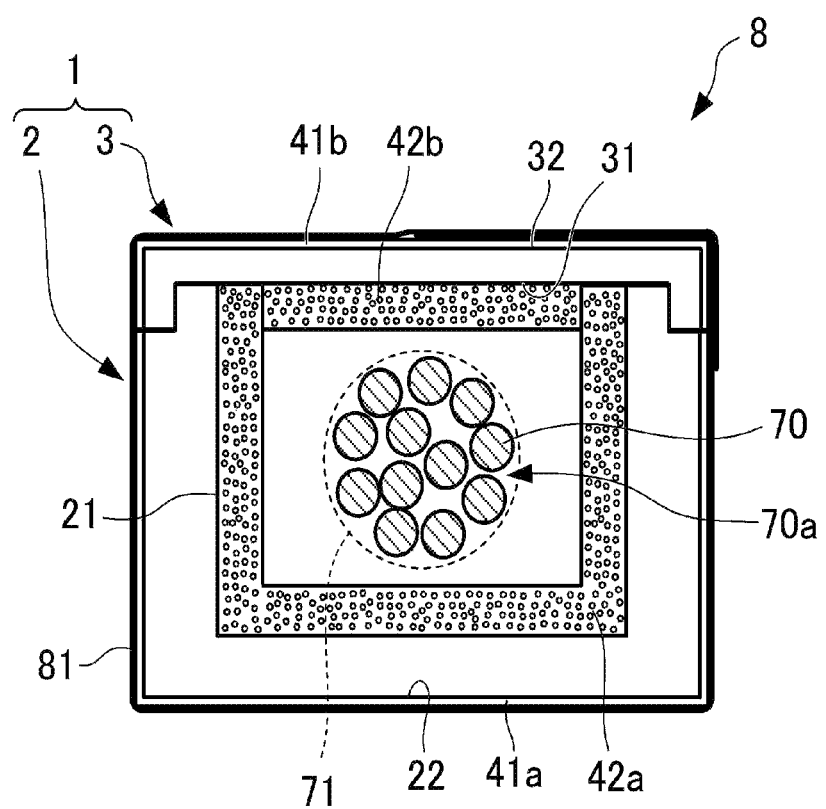
FIG. 3 is a diagram showing a configuration of a cross-section of the wire harness shown in FIG. 2C, taken along a line A-A before a heating step.

FIG. 3 shows the cross-sectional structure of the wire harness 8 taken along a line A-A, in state in which the protector 1 shown in FIG. 2C has been closed, covered, and bound. As shown in FIG. 3, when the protector main body 2 is closed by the cover portion 3, that is to say before the wire harness 8 is heated, the foaming urethane layer 42a formed on the inner surface portion of the recessed surface portion 21 of the protector main body 2 and the foaming urethane layer 42b formed on the inner surface portion 31 of the cover portion 3 are separated from the surface of the group of electrical lines 70a via a gap formed therebetween.

Figure 4:
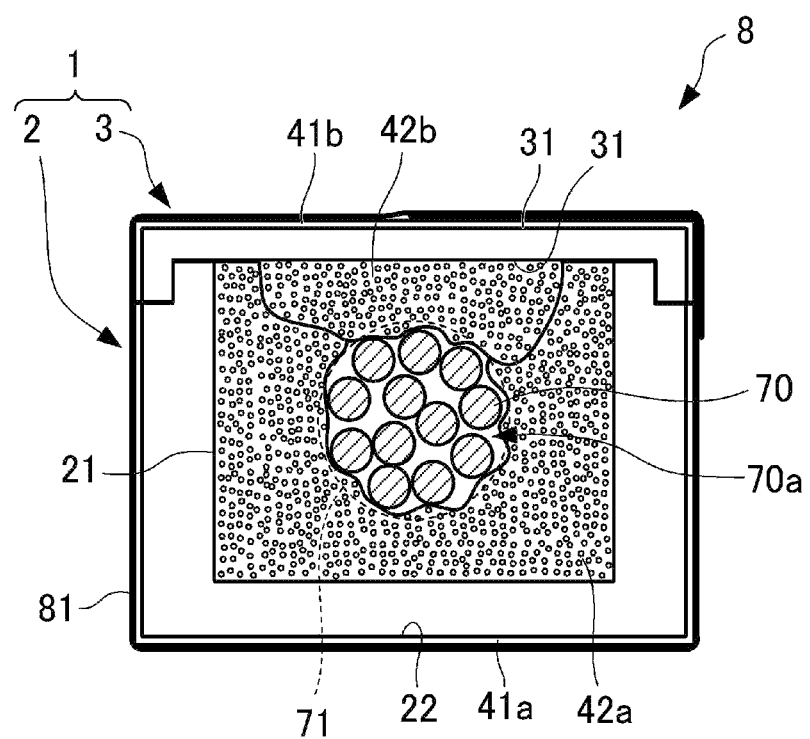
FIG. 4 is a diagram showing a configuration of a cross-section of the wire harness shown in FIG. 2C, taken along the line A-A after the heating step.

When a heating step is executed using the aforementioned heating shown in FIG. 2C in this state, the foaming urethane layers 42a and 42b undergo foaming at the aforementioned heating temperature and expand in volume by a factor of approximately 3 or more as shown in FIG. 4. Accordingly, this corresponds to a state in which the foaming urethane layers 42a and 42b undergo foaming so as to fill in the gap between them and the group of electrical lines 70a and tightly hold the group of electrical lines 70a.

Also, in the foamed state of the foaming urethane layers 42a and 42b shown in FIG. 4, due to the fact that a metal powder is included in the foaming urethane layers 42a and 42b, and the fact that volume of the foaming urethane layers 42a and 42b containing the metal powder increases, there are effects from two viewpoints, namely that there is an improvement in the electromagnetic shielding effect, and that there is an improvement in heat insulation performance.

Also, the above-described effects are achieved by performing heating processing in the covering and heating step shown in FIG. 2C, and there is no need for the conventional tasks of wrapping a metal sheet for heat insulation and wrapping a metal sheet for shielding around the protector.

In this way, with the wire harness 8 of the present embodiment, the foil films 41a and 41b formed on the outer surface portions of the protector main body 2 and the cover portion 3 have shielding capability, and the foaming urethane layers 42a and 42b that are formed in the protector main body 2 and the cover portion 3 and contain a high magnetic permeability metal powder have shielding capability due to foaming and filling in the region surrounding the group of electrical lines 70a. Accordingly, it is possible to improve the shielding capability, and it is possible to reduce the number of man-hours in human labor compared to conventional technology that requires human labor for attaching the protector 1 of the present embodiment to protect the group of electrical lines 70a, and then wrapping metal foil around the protector.

Second Embodiment

Next, a protector 1A and a wire harness 8A of a second embodiment will be described with reference to FIGS. 5, 6A, and 6B. Note that in the protector 1A of the present embodiment shown in FIGS. 5, 6A, and 6B, constituent elements that are the same as in the protector 1 of the first embodiment shown in FIG. 1 are denoted by the same reference signs and will not be described. The following description focuses on differences.

Figure 5:
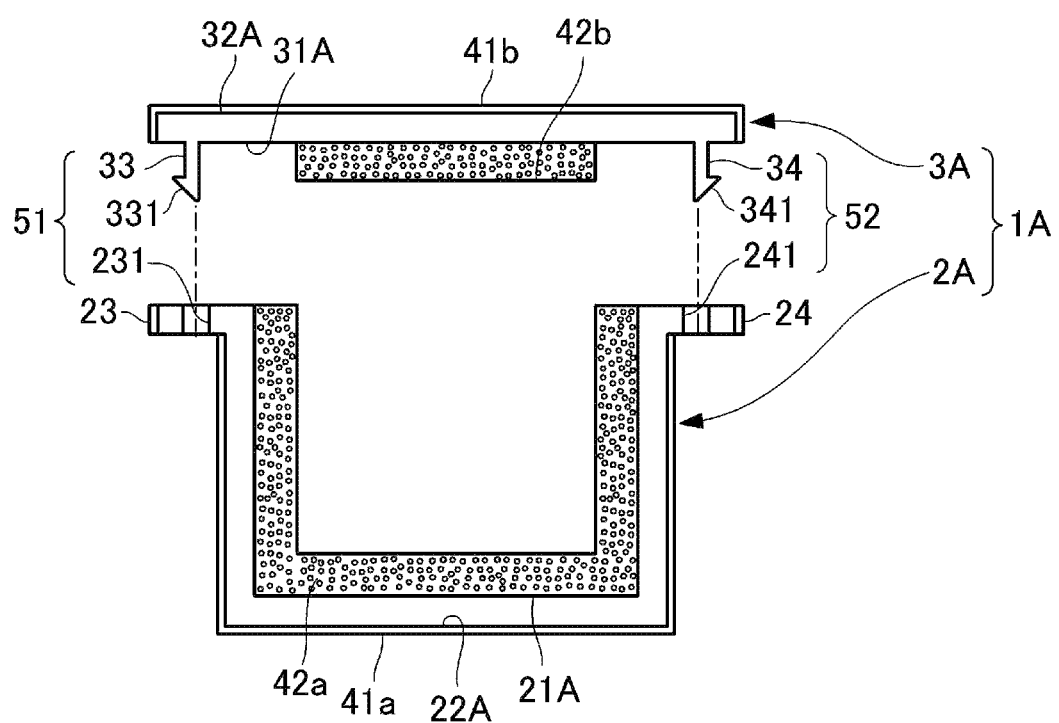
FIG. 5 is a diagram showing a configuration of a cross-section of a protector according to a second embodiment.

As shown in FIG. 5, the protector 1A of the present embodiment is constituted by a protector main body 2A, which has a groove-shaped recessed surface portion 21A for accommodating a group of electrical lines 70a, and a cover portion 3A that closes the recessed surface portion 21A of the protector main body 2A.

The protector main body 2A has cover receiving portions 23 and 24 provided on the end portions on two sides of the open side of the recessed surface portion 21A. The cover receiving portions 23 and 24 are respectively provided with opening portions 231 and 241 that correspond to below-described projection portions 33 and 34 provided on the cover portion 3A.

The projection portions 33 and 34, which can be fitted into the opening portions 231 and 241 of the cover receiving portions 23 and 24, are provided on the cover portion 3A at positions on the inner surface portion 31A that correspond to the cover receiving portions 23 and 24 of the protector main body 2A. Also, S claw portions 331 and 341 are respectively provided at the tip portions of the projection portions 33 and 34.

When closing the protector 1A, as shown in FIG. 5, the cover portion 3A is held in the hand such that the projection portions 33 and 34 of the cover portion 3A face the cover receiving portions 23 and 24 of the protector main body 2A, then the S claw portions 331 and 341 of the projection portions 33 and 34 of the cover portion 3A are respectively fitted into the opening portions 231 and 241 of the cover receiving portions 23 and 24 of the protector main body 2A, and then the lower surface of the inner surface portion 31A of the cover portion 3A is lowered until it comes into contact with the upper surface of the cover receiving portions 23 and 24.

At this time, the projection portions 33 and 34 of the cover portion 3A have elasticity due to being made of synthetic resin, and thus bend inward by an amount corresponding to the width of the S claw portions 331 and 341, pass through the opening portions 231 and 241, and return to the original unbent state once the closing is complete and the S claw portions 331 and 341 have fully passed through the opening portions 231 and 241. Accordingly, the S claw portions 331 and 341 of the projection portions 33 and 34 engage with the lower portions of the cover receiving portions 23 and 24, and the cover portion 3A enters the locked state. In this way, in FIG. 5, the projection portion 33 on the cover portion 3A side and the opening portion 231 on the cover receiving portion 23 side of the protector main body 2A, as well as the projection portion 34 on the cover portion 3A side and the opening portion 241 on the cover receiving portion 24 side of the protector main body 2A respectively constitute male-female lock means 51 and 52 in which the elasticity of the projection portions 33 and 34 is used to respectively fit them into the opening portions 231 and 241 and latch them with the S claw portions 331 and 341.

As described above, in the protector 1A, the opening portions 231 and 241 are formed in the protector main body 2A at the two end portions of the groove-shaped recessed surface portion 21A for accommodating the group of electrical lines 70a, and the opening portions 231 and 241 are female locking members that receive male locking members for locked fitting. On the other hand, in the protector 1A, at two end portions of the inner surface portion 31A of the cover portion 3A, the projection portions 33 and 34 are provided at positions that face the opening portions 231 and 241 of the protector main body 2A, and the projection portions 33 and 34 have the S claw portions 331 and 341 that are male locking members that are fitted into and locked to the opening portions 231 and 241.

Besides having the lock means 51 and 52, the configuration of the protector 1A is equivalent to the protector 1 of the first embodiment. In other words, similarly to the first embodiment, in the protector 1A, foaming urethane layers 42a and 42b are formed on the recessed surface portion 21A of the protector main body 2A and the inner surface portion 31A of the cover portion 3A, and foil films 41a and 41b are formed on an outer surface portion 22A of the protector main body 2A and an outer surface portion 32A of the cover portion 3A.

In this way, the protector 1A of the present embodiment has a configuration in which the cover portion 3A is provided separately from the protector main body 2A, and at the time of closing, the closed state is held by the locking of the male-female lock means 51 and 52 that are made up of the projection portions 33 and 34 on the cover portion 3A side and the opening portions 231 and 241 on the cover receiving portions 23 and 24 side of the protector main body 2A, which are provided at the end portions on two sides of the inner surface portion 31A of the cover portion 3A and the end portions on two sides of the recessed surface portion 21A of the protector main body 2A.

According to this configuration, the protector 1A of the present embodiment has effects equivalent to those of the protector 1 of the first embodiment. Furthermore, the protector 1A of the present embodiment has an effect in that the cover portion 3A can be closed in a not-easily-detachable state by merely placing the separate cover portion 3A on the protector main body 2A and locking it with the male-female lock means 51 and 52, and there is no need for a step of wrapping the adhesive tape 81 around the protector 1A after closing.

Next, the wire harness 8A of the present embodiment will be described with reference to FIGS. 6A and 6B.

In order to protect a harness trunk line using the protector 1A of the present embodiment, three steps are performed in a sequence equivalent to the sequence shown in FIG. 2, namely a binding step (see FIG. 2A) of partially binding the group of electrical lines 70a with the adhesive tape 71, an accommodating step (see FIG. 2A) of accommodating the partially bound group of electrical lines 70a in the recessed portion of the protector main body 2A in the open state, and a closing step (see FIG. 2B) of closing the recessed portion of the protector main body 2A using the cover portion 3A.

In particular, in the present embodiment, in the closing step, after the partially bound group of electrical lines 70a has been accommodated inside (in the recessed portion of) the recessed surface portion 21A of the protector main body 2A in the state in which the cover portion 3A is open, closing is performed by lowering the cover portion 3A such that the S claw portions 331 and 341 at the tip portions of the projection portions 33 and 34 of the cover portion 3A are fitted into the corresponding opening portions 231 and 241 of the cover receiving portions 23 and 24 on the protector main body 2A side.

Figure 6A:
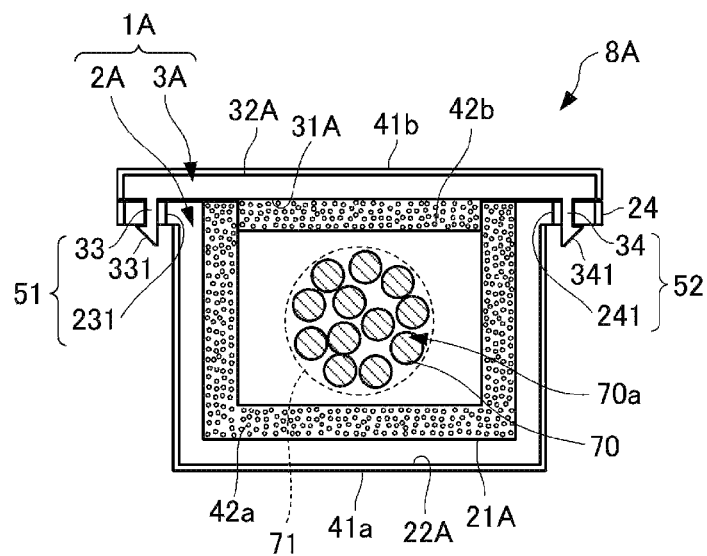
FIGS. 6A and 6B are diagrams showing a configuration of a cross-section of a wire harness that uses the protector according to the second embodiment, where

In the state in which closing is complete, as shown in FIG. 6A, the bending of the projection portions 33 and 34 that occurred during passage through the opening portions 231 and 241 is released, and the S claw portions 331 and 341 engage with the lower surface side of the opening portions 231 and 241, thus locking the cover portion 3A in a state in which the cover portion 3A cannot open. For this reason, in the present embodiment, it is not necessarily required to perform the tape wrapping step (FIG. 2C) of wrapping the adhesive tape 81 around the protector main body 2A and the cover portion 3A in the closed state.

The protector 1A of the present embodiment has the cross-sectional structure shown in FIG. 6A, for example, in the state in which the protector main body 2A has been closed by the cover portion 3A in the closing step. In FIG. 6A, the wire harness 8A of the present embodiment is constituted by the protector 1A, which includes the cover portion 3A that closes the protector main body 2A, and the group of electrical lines 70a, which passes through the space formed by the recessed surface portion 21A of the protector main body 2A and the inner surface portion 31A of the cover portion 3A of the protector 1A.

As shown in FIG. 6A, before being heated, the wire harness 8A is in a state in which the foaming urethane layer 42a formed on the inner surface portion of the recessed surface portion 21A of the protector main body 2A and the foaming urethane layer 42b formed on the inner surface portion 31A of the cover portion 3A are separated from the surface of the group of electrical lines 70a via a gap formed therebetween.

Figure 6B:
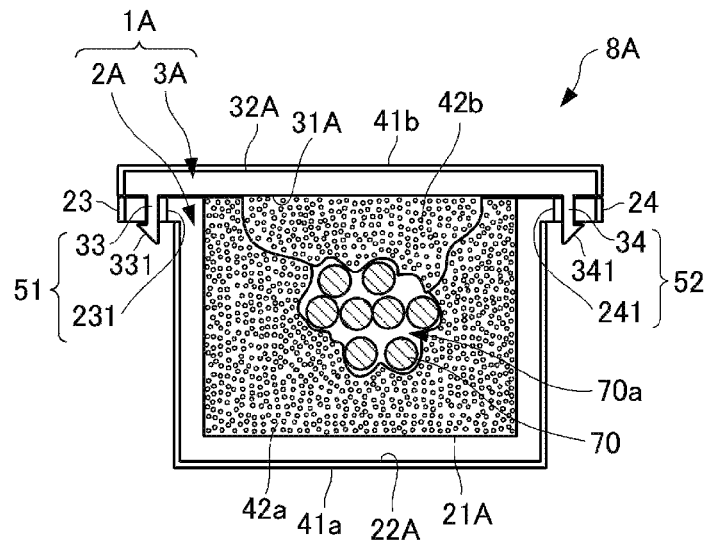

When the wire harness 8A shown in FIG. 6A is heated from the outside to a temperature of 80° C. or higher, for example, that is to say when the heating step shown in FIG. 2C is executed, the foaming urethane layers 42a and 42b undergo foaming at the aforementioned heating temperature and expand in volume by a factor of approximately 3 or more as shown in FIG. 6B. Accordingly, this corresponds to a state in which the foaming urethane layers 42a and 42b undergo foaming so as to fill in the gap between them and the group of electrical lines 70a and tightly hold the group of electrical lines 70a.

In this way, similarly to the wire harness 8 of the first embodiment, the wire harness 8A of the present embodiment has a configuration in which the group of electrical lines 70a partially bound at multiple locations using the adhesive tape 71 is accommodated in the recessed portion of the protector 1A, the cover portion 3A is held in the closed state, and then heating to a predetermined high temperature is performed to cause the foaming urethane layers 42a and 42b to expand and fill in the region surrounding the group of electrical lines 70a in the protector 1A, and thus the wire harness 8A of the present embodiment has effects equivalent to the wire harness 8 of the first embodiment.

Also, the wire harness 8A of the present embodiment uses the protector 1A in which the cover portion 3A is provided separately from the protector main body 2A, and at the time of closing, the male-female lock means 51 and 52 provided on end portions on two sides of the cover portion 3A and on end portions on two sides of the protector main body 2A are locked to hold the closed state. Accordingly, the wire harness 8A of the present embodiment has an effect in that there is no need for the tape wrapping step that uses the adhesive tape 81 prior to the step of heating the protector 1A after the closing step, and it is possible to further reduce the number of man-hours in human labor.

Third Embodiment

Next, a protector 1B and a wire harness 8B of a third embodiment will be described with reference to FIGS. 7, 8A, and 8B. Note that in the protector 1B of the present embodiment shown in FIGS. 7, 8A, and 8B, constituent elements that are the same as in the protector 1 of the first embodiment shown in FIG. 1 and the protector 1A of the second embodiment shown in FIG. 5 are denoted by the same reference signs and will not be described. The following description focuses on differences.

Figure 7:
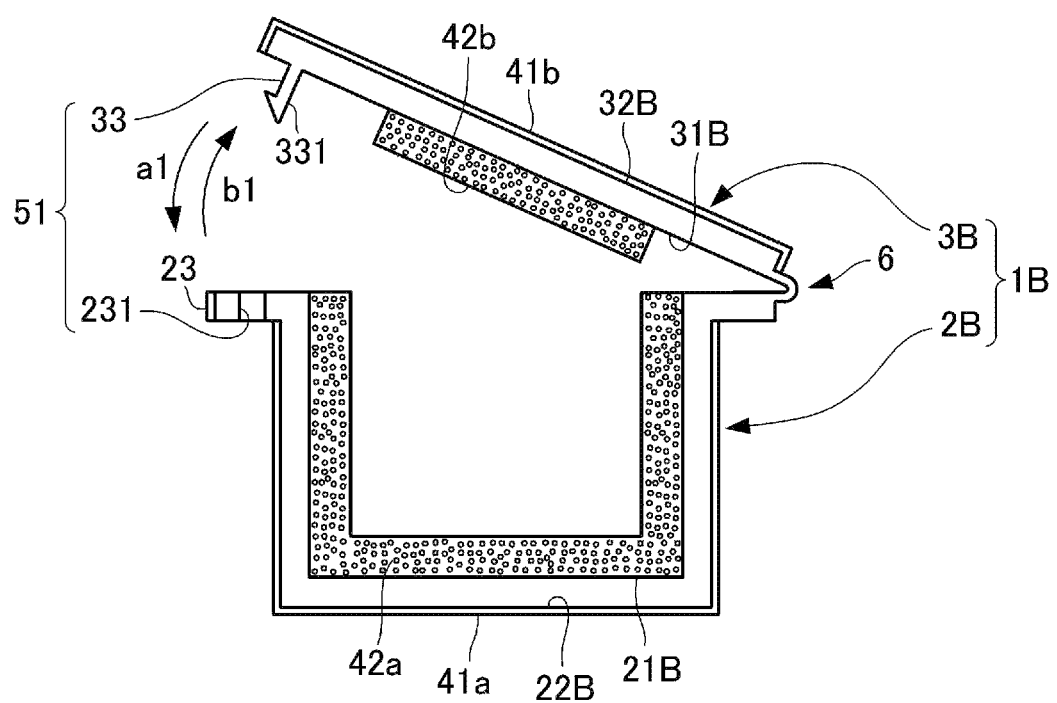
FIG. 7 is a diagram showing a configuration of a cross-section of a protector according to a third embodiment.

As shown in FIG. 7, in the protector 1B of the present embodiment, a cover portion 3B is provided so as to be connected to one side of a recessed surface portion 21B side of a protector main body 2B via a hinge portion 6. Accordingly, the cover portion 3B of the protector 1B can rotate, via the hinge portion 6, in the directions indicated by arrows a1 and b1 between the open state shown in FIG. 7 and the closed state during use in the wire harness 8B shown in FIGS. 8A and 8B.

Besides the cover portion 3B being provided so as to be connected to one side of the recessed surface portion 21B side of the protector main body 2B via the hinge portion 6, the structure of the protector 1B is equivalent to that of the protector 1A of the second embodiment. In other words, the protector 1B is provided with the projection portion 33 that has the S claw portion 331 on the side of the inner surface portion 31B of the cover portion 3B opposite to the side on which the hinge portion 6 is provided. Also, the opening portion 231 into which the projection portion 33 can be fitted is provided in the cover receiving portion 23 on the other side of the recessed surface portion 21B of the protector main body 2B, that is to say the side on which the hinge portion 6 is not provided. Similarly to the second embodiment, the projection portion 33 and the opening portion 231 constitute a male-female lock means 51.

Also, similarly to the first and second embodiments, in the protector 1B, the foaming urethane layers 42a and 42b are formed on the recessed surface portion 21B of the protector main body 2B and the inner surface portion 31 of the cover portion 3, and the foil films 41a and 41b are formed on an outer surface portion 22B of the protector main body 2B and an outer surface portion 32B of the cover portion 3B.

In this way, the protector 1B of the present embodiment has a configuration in which the cover portion 3B is provided so as to be connected to one side of the recessed surface portion 21B side of the protector main body 2B via the hinge portion 6, and at the time of closing, the male-female lock means 51 provided on the cover portion 3B and the protector main body 2B locks so as to hold the closed state, thus having an effect similar to the protector 1 of the first embodiment and the protector 1A of the second embodiment, and also having an effect of being able to be handled without separating the protector main body 2B and the cover portion 3B, thus improving the ease of the closing task.

Next, the wire harness 8B of the present embodiment will be described with reference to FIGS. 8A and 8B.

In order to protect a harness trunk line using the protector 1B of the present embodiment, three steps are performed in a sequence equivalent to the sequence shown in FIG. 2, namely a binding step (see FIG. 2A) of partially binding the group of electrical lines 70a with the adhesive tape 71, an accommodating step (see FIG. 2A) of accommodating the partially bound group of electrical lines 70a in the recessed portion of the protector main body 2B in the open state, and a closing step (see FIG. 2B) of closing the recessed portion of the protector main body 2B using the cover portion 3B.

In the closing step, after the partially bound group of electrical lines 70a has been accommodated inside the recessed surface portion 21 of the protector main body 2B in the state in which the cover portion 3B is open, the cover portion 3B is closed by being rotated such that the tip of the projection portion 33 of the cover portion 3B is fitted into the opening portion 231.

In the state in which closing is complete, as shown in FIG. 8A, the S claw portion 331 of the projection portion 33 engages with the lower surface side of the cover receiving portion 23 at the position of having fully passed through the opening portion 231, thus locking the cover portion 3B in a state in which the cover portion 3B cannot open. Accordingly, in the present embodiment, it is not necessarily required to perform the tape wrapping step (FIG. 2C) of wrapping the adhesive tape 81 around the protector main body 2B and the cover portion 3B in the closed state.

The protector 1B of the present embodiment has the cross-sectional structure shown in FIG. 8A, for example, in the state in which the protector main body 2B has been closed by the cover portion 3B in the closing step. In FIG. 8A, the wire harness 8B of the present embodiment is constituted by the protector 1B, which includes the cover portion 3B that closes the protector main body 2B, and the group of electrical lines 70a, which passes through the space formed by the recessed surface portion 21B of the protector main body 2B and the inner surface portion 31B of the cover portion 3B of the protector 1B.

In the wire harness 8B shown in FIG. 8A, the foaming urethane layer 42a formed on the inner surface portion of the recessed surface portion 21B of the protector main body 2B and the foaming urethane layer 42b formed on the inner surface portion 31B of the cover portion 3B are separated from the surface of the group of electrical lines 70a via a gap formed therebetween.

When the wire harness 8B shown in FIG. 8A is heated from the outside to a temperature of 80° C. or higher, for example, that is to say when the heating step shown in FIG. 2C is executed, the foaming urethane layers 42a and 42b undergo foaming at the aforementioned heating temperature and expand in volume by a factor of approximately 3 or more as shown in FIG. 8B. Accordingly, this corresponds to a state in which the foaming urethane layers 42a and 42b undergo foaming so as to fill in the gap between them and the group of electrical lines 70a and tightly hold the group of electrical lines 70a.

In this way, similarly to the wire harness 8 of the first embodiment and the wire harness 8A of the second embodiment, the wire harness 8B of the present embodiment has a configuration in which the group of electrical lines 70a partially bound at multiple locations using the adhesive tape 71 is accommodated in the recessed portion of the protector 1B, the cover portion 3B is held in the closed state, and then heating to a predetermined high temperature is performed to cause the foaming urethane layers 42a and 42b to expand and fill in the region surrounding the group of electrical lines 70a in the protector 1B, and thus the wire harness 8B of the present embodiment has effects equivalent to the wire harness 8 of the first embodiment and the wire harness 8A of the second embodiment.

Also, the wire harness 8B of the present embodiment uses the protector 1B in which the cover portion 3B is provided so as to be connected to one side of the recessed surface portion 21B side of the protector main body 2B via the hinge portion 6, and at the time of closing, the male-female lock means 51 provided on the cover portion 3B and the protector main body 2B locks so as to hold the closed state. Accordingly, the wire harness 8B of the present embodiment has an effect in that there is no need for the tape wrapping step that uses the adhesive tape 81 prior to the step of heating the protector 1B, and it is possible to further reduce the number of man-hours in human labor.

Other Embodiments

The present invention is not limited to the embodiments described above, and the technical scope recited in the claims encompasses various design modifications that do not depart from the spirit of the invention. Although the above embodiments give examples in which the foaming urethane layers 42a and 42b are formed at positions capable of enclosing the entire circumference of the protection-target group of electrical lines 70a before closing and foaming, the formation positions of the foaming urethane layers 42a and 42b, as well as the shapes, thicknesses, and the like thereof can be set as desired.

As described above, the present design has effects of having piercing resistance, enabling giving shielding capability to the protector, enabling reducing the number of man-hours in human labor, and enabling realizing low cost, and thus is useful to general protectors and wire harnesses.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A protector comprising:
a protector main body that is made of a synthetic resin and has a groove-shaped recessed surface portion in which a group of electrical lines is to be accommodated, a foil film being formed on an outer surface portion of the protector main body; and
a cover portion that is made of a synthetic resin and closes the recessed surface portion of the protector main body, a foil film being formed on an outer surface portion of the cover portion,
wherein a foaming urethane layer having a predetermined thickness and containing a high magnetic permeability metal powder is formed on at least the recessed surface portion of the protector main body.

2. The protector according to claim 1, wherein a foaming urethane layer having a predetermined thickness and containing a high magnetic permeability metal powder is formed on an inner surface portion of the cover portion as well.

3. A wire harness comprising:
a group of electrical lines partially bound at a plurality of locations using adhesive tape; and
the protector according to claim 1,
wherein by performing heating to a predetermined high temperature in a state in which the group of electrical lines is accommodated in a recessed portion of the protector main body and the cover portion is held in a closed state, the foaming urethane layer expands and fills in a region surrounding the group of electrical lines in the protector.

4. A wire harness comprising:
a group of electrical lines partially bound at a plurality of locations using adhesive tape; and
the protector according to claim 2,
wherein by performing heating to a predetermined high temperature in a state in which the group of electrical lines is accommodated in a recessed portion of the protector main body and the cover portion is held in a closed state, the foaming urethane layer expands and fills in a region surrounding the group of electrical lines in the protector.

* * * * *